United States Patent [19]

Roberts et al.

[11] 3,983,412

[45] Sept. 28, 1976

[54] DIFFERENTIAL SENSE AMPLIFIER

[75] Inventors: Gregory Roberts; Roger Badertscher, both of Cupertino, Calif.

[73] Assignee: Fairchild Camera and Instrument Corporation, Mountain View, Calif.

[22] Filed: July 2, 1975

[21] Appl. No.: 592,706

[52] U.S. Cl. ............................ 307/235 F; 307/238; 307/279; 307/DIG. 3; 340/173 R
[51] Int. Cl.[2] ................... H03K 5/20; H03K 3/286; H03K 3/353; G11C 11/40
[58] Field of Search ............. 307/235 F, 235 T, 238, 307/247 R, 279, DIG.3; 340/173 R

[56] References Cited
UNITED STATES PATENTS

| | | |
|---|---|---|
| 3,714,471 | 1/1973 | Au ...................................... 307/279 |
| 3,771,147 | 11/1973 | Boll et al. ...................... 307/DIG. 3 |
| 3,838,295 | 9/1974 | Lindell ............................... 307/238 |
| 3,840,757 | 10/1974 | Nomiya et al .............. 307/247 R X |

FOREIGN PATENTS OR APPLICATIONS

| | | |
|---|---|---|
| 1,196,216 | 6/1970 | United Kingdom ................. 307/279 |

Primary Examiner—John S. Heyman
Assistant Examiner—Larry N. Anagnos
Attorney, Agent, or Firm—Alan H. MacPherson; Henry K. Woodward; J. Ronald Richbourg

[57] ABSTRACT

An amplifier for sensing two signals at differing voltages which has a translated differential output at standard MOS digital signal levels. The amplifier is particularly well suited for sensing the logic state of a plurality of binary static electronic memory cells each of which is selectively connectable to a pair of sense lines.

6 Claims, 3 Drawing Figures

DIFFERENTIAL SENSE AMPLIFIER

BACKGROUND OF THE INVENTION

1. Field of the Invention

The invention relates generally to the field of electronic amplifiers and particularly to differential amplifiers used for sensing the binary logic state of a static electronic memory cell.

2. Prior Art

Semiconductor Random Access Memories (RAM's) of the type having a plurality of substantially identical memory cells can be broadly classified as either static or dynamic depending on the amount of D.C. power they dissipate during operation. Dynamic memories are generally low-power devices which store small quantities of the charge representative of binary information on capacitances. These small quantities of charge continually dissipate and must be periodically refreshed. Therefore, dynamic memories typically require special external clocking and refresh circuitry which is both complicated and expensive for a designer to incorporate in a digital system. Additionally, the output signals from these memories are often not compatible with standard transistor-transistor logic (TTL) levels and external interface circuits must be used where such compatibility is required.

Static memories continually dissipate D.C. power. In these memories, binary information is typically stored in a bistable flip-flop circuit in each memory cell. Each flip-flop circuit is securely latched in a selected operating mode corresponding to a given binary state by the continuous flow of a small current through each memory cell. Static memories may be either slow or fast depending on their architecture and the techniques used in their fabrication; however, they generally do not require any special clocking circuitry or refresh means and many of them have inputs and outputs which are compatible with standard TTL logic levels. Therefore, static memories are generally easier for a designer to incorporate in digital applications such as computer terminals and perpherials.

Static electronic memories are manufactured in integrated circuit form using various competing microelectronic technologies to obtain trade offs in operating speed, cost, and power consumption. N-channel silicon gate Metal Oxide Semiconductor (MOS) technology is particularily attractive from the standpoint of cost and power consumption. The access speed of static MOS RAM's is somewhat slower than access speed achievable using other technologies such as bi-polar Emitter Coupled Logic (ECL).

Among the many factors which influence the access speed of static MOS RAM's is the design of the sense amplifier used to detect the differential output signals from a memory cell. The differential output signals from a memory cell are selectively connectable to a pair of column bit lines which are selectively connectable to the sense amplifier. The differential signals on such column bit lines are typically 5.0 volts and 2.5 volts. When one of the bit lines is at 5.0 volts, and other is at 2.5 volts. Thus, the two binary states correspond to the two possible signal configurations. These signals levels (i.e., one high; generally the power supply voltage, and one intermediate voltage) are not compatible with standard MOS digital levels (i.e., one high; generally the power supply voltage, and one low, some voltage less than the threshold voltage for an enhancement mode MOS device.) Therefore, the sense amplifier must detect the logic state represented by the differential voltages and translate this information to standard MOS digital signal levels. Historically, it has been a difficult task to efficiently implement this translation.

Prior art static MOS RAM's have utilized differential Schmidt trigger circuits in their sense amplifiers. The Schmidt trigger design works, but suffers from a number of shortcomings. For example, when the circuit is designed to have the appropriate MOS digital level output signals, the input signal differential required to cause the trigger to change its output state is at least two volts. If the circuit was responsive to smaller input voltage differentials, then the speed of the trigger would be increased. Another problem associated with differential Schmidt triggers used in static MOS RAM sense amplifiers is that the time required for the circuit to charge the output line from a low signal level to a high signal level is inherently longer than the time required to discharge the output line from a high signal level to a low signal level. Unfortunately, no matter how fast the output line discharge rate, the useful speed of the circuit is limited by the slower output line charging rate. Both the output line charging rate and the minimum voltage differential required to cause the trigger to change its output state are dependent upon the threshold voltages of the transistors which comprise the trigger circuit. Because the transistor threshold voltage are dependent on process parameter variations, the actual access times of static MOS RAM's vary greatly from run to run and wafer to wafer.

SUMMARY OF THE INVENTION

The present invention overcomes many of the disadvantages associated with prior art differential sense amplifiers used in static MOS RAM's. The differential amplifier circuit of the invention employs a cross-coupled binary flip-flop possessing a pair of nodes and novel pull down means connected to these nodes for selectively latching the flip-flop. The amplifier circuit is symmetrical in operation in that the transition times from either binary state to the other binary states are identical. The circuit of this invention requires an input signal differential of only 1 volt to 1.5 volts to toggle its binary state.

When the invention is embodied as an N-channel MOS integrated circuit on a chip of semiconductor material in combination with a plurality of static memory cells, the resulting RAM is significantly faster than similar RAM's employing prior art sense amplifiers. This higher speed of operation extends the range of digital applications in which such memories can be successfully incorporated. Because of its symmetrical operation and smaller input signal differential requirement, the invention is relatively insensitive to integrated circuit manufacturing process parameter variations. This relative process insensitivity results in higher, more uniform manufacturing yields and lower static RAM costs.

BRIEF DESCRIPTION OF THE DRAWINGS

The many objects and advantages of the present invention will become apparent to those skilled in the art when the following description of the best mode contemplated for practicing the invention is read in conjunction with the accompanying drawings, wherein like reference characters refer to the same or similar elements, and in which.

DETAILED DESCRIPTION OF THE PREFERRED EMBODIMENT

Figure 1:
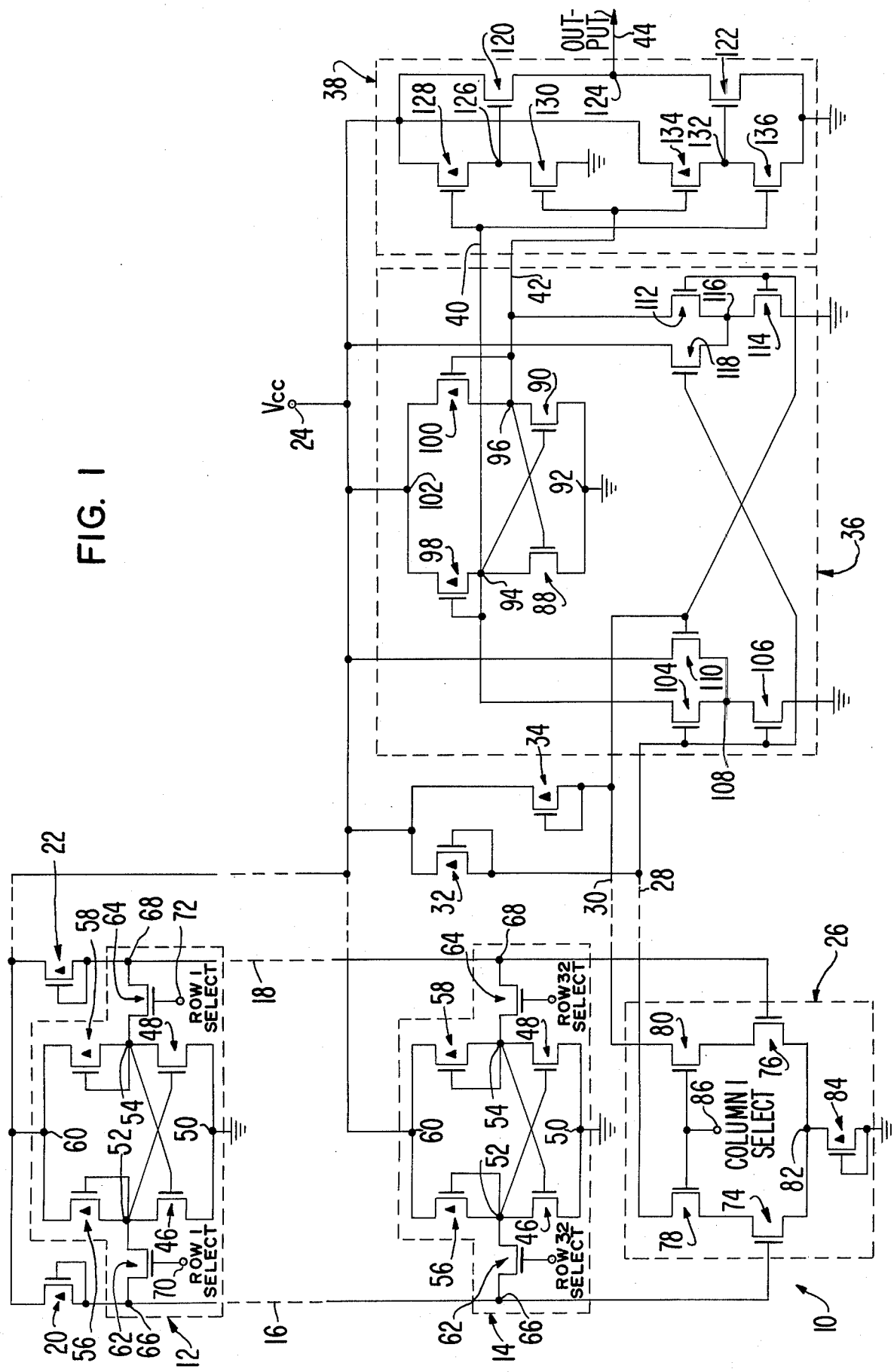
FIG. 1 is a partial schematic diagram of a static RAM showing the relationship between the individual memory cells and the differential sense amplifier of the invention.

Referring now generally to the several figures and specifically to FIG. 1, a portion of a static RAM circuit 10 is shown comprised of a plurality of substantially identical individual memory cells such as cells 12 and 14 which are arrayed in a column. In the FIG. 1 embodiment, only one column of 32 memory cells is shown. It will be understood that, subject to the space available on an integrated circuit chip, a plurality of memory cells may be disposed in an array of as many rows and columns as are desired. Every memory cell in each column is selectively connectable to a pair of column bit lines 16 and 18 uniquely associated with each column. In the presently preferred embodiment all the transistors are N-channel MOS Field Effect Transistors (MOSFET's) which employ polycrystalline silicon gates and include a gate electrode, a drain and a source.

Throughout the several figures the MOSFET's identified with darkened triangles are depletion mode devices while all others are enhancement mode devices. Although the presently preferred embodiment is fabricated as an integrated circuit on a chip of semiconductor material, it will be understood that the differential sense amplifier of the invention can also be constructed from discrete components. Moreover, the invention can also be practiced with P-channel MOSFET's, bipolar devices, electron tubes, or the like.

The column bit lines 16 and 18 are each connected to a load MOSFET 20 and 22, respectively. These load MOSFET's 20 and 22 are depletion mode devices having their gate electrodes connected to their sources and their drains connected to a selected positive supply voltage $V_{CC}$ which is applied at a node 24. Each pair of column bit lines 16 and 18 are connected to a column selecting circuit 26 which functions to selectively connect the output from a specified memory cell to a pair of sense lines 28 and 30. These sense lines are also biased with a pair of depletion mode load MOSFET's 32 and 34 the drains of which are both connected to the selected positive supply voltage $V_{CC}$. The sense lines 28 and 30 are the inputs to the differential sense amplifier of the invention 36. The differential outputs from the sense amplifier 36 which are at digital MOS signal levels are fed to a data output buffer 38 through a pair of differential amplifier output lines 40 and 42. Depending upon the binary state of the specified memory cell being read, the data output buffer 38 provides a 100 μA, three volt output signal or a 2mA path to ground on a data output line 44.

Memory cells 12 and 14 comprise bistable circuits (i.e., circuits each of which can exist infinitely in either of two stables states and which can be induced to make an abrupt transistion from one state to the other by means of external excitation.) In the FIG. 1 embodiment, the differential sense amplifier of the invention 36 only functions to facilitate reading information out from a memory cell. Therefore, the external excitation means for writing data into each cell are not shown in the FIG. 1 RAM.

The bistable circuit in memory cell 12 is comprised of a pair of MOSFET's 46 and 48 the sources of which are each connected to ground at a common source node 50. A pair of storage nodes 52 and 54 are formed by connecting the gate electrode of the MOSFET 48 to the drain of the MOSFET 46 and by connecting the gate electrode of the MOSFET 46 to the drain of the MOSFET 48. Voltage is continuously maintained at the storage nodes 52 and 54 through a pair of depletion mode MOSFET's 56 and 58 which function much like load resistors. These load MOSFET's 56 and 58 have their drains connected together at a node 60 which is in turn connected to the selected positive supply voltage $V_{CC}$ applied at the node 24. The gate electrodes of the MOSFET's 56 and 58 are connected to their respective sources which are in turn connected to the storage nodes 52 and 54, respectively.

In the FIG. 1 embodiment, the selected positive supply voltage $V_{CC}$ is approximately 5.0 volts. Throughout this description the binary state 1 corresponds to the stable circuit state in which the MOSFET 46 is OFF and the MOSFET 48 is ON. Under these conditions the storage node 52 is at $V_{CC}$ and the storage node 54 is at $V_{LO}$ which is approximately 0.5 volts. Conversely, the binary state 0 corresponds to the stable state in which the MOSFET 46 is ON and the MOSFET 48 is OFF. In this state the storage node 52 is at $V_{LO}$ and the storage node 54 is at $V_{CC}$. The storage nodes 52 and 54 are selectively connectable to their associated column bit lines 16 and 18, through a pair of MOSFET's 62 and 64, respectively. One terminal of the MOSFET 62 is connected to the common bit line 16 at a node 66 while the other terminal is connected to the storage node 52. Similarly, one terminal of the MOSFET 64 is connected to the column bit line 18 at a node 68 while the other terminal is connected to the storage node 54. The memory cell 12 is connected to the pair of column bit lines 16 and 18 when the MOSFET's 62 and 64 are turned ON by applying a selected forcing voltage to their gate electrodes at nodes 70 and 72 respectively.

Figure 3:
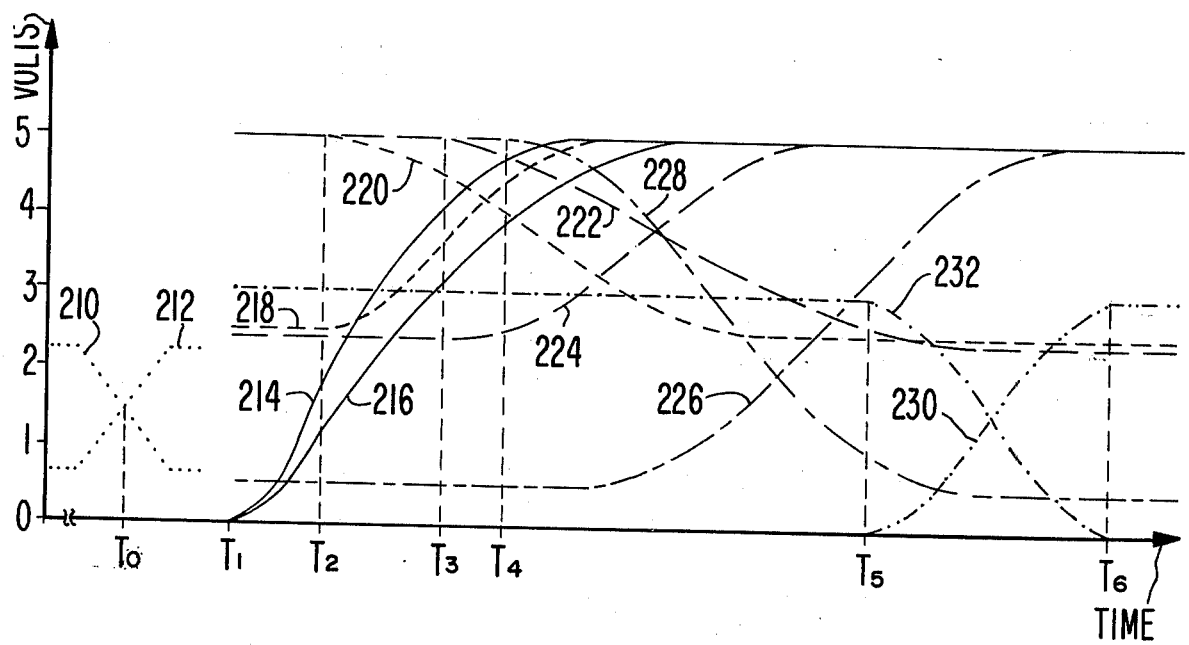
FIG. 3 is a stylized graphical representation of selected voltages occurring in the RAM of FIG. 1 during a read operation as the differential sense amplifier changes its binary state.

FIG. 3 is a stylized graphical representation of selected voltages associated with the RAM of FIG. 1 during a read operation. The various waveforms shown are only illustrative and assume that the binary state being read from a selected memory cell differs from the binary state previously read. In the following description of a read operation the memory cell 12 in row 1 and column 1 is interrogated. It is to be understood that the bistable circuit in this memory cell is in the stable mode corresponding to the binary state 1. So that FIG. 3 is consistent with the description, it will be further understood that another read operation immediately preceded the described read operation. This immediately preceding operation interrogated another memory cell in column 1 whose stable mode corresponded to the binary state 0.

A read operation begins when an address code is established at a time $T_0$. This time is shown stylistically at the intersection of a pair of worst case address code waveforms 210 and 212. The signals are shown with a high level of 2.2 volts and a low level of 0.65 volts. These voltages correspond respectively to the minimum allowable high signal level and the maximum allowable low signal level required for TTL compatibility. Later, as shown at time $T_1$, a column selection signal represented by the curve 214 is applied at a node 86 in the column 1 select circuit 26. Simultaneously, a row select signal represented by the curve 216 is applied to all the memory cells in row 1 generally and to the nodes 70 and 72 in memory cell 12 specifically. Although the column selection and row selection signals are applied together, the greater inherent parasitic and device capacitance associated with the row selection lines in the FIG. 1 embodiment cause the nodes 70 and 72 to charge more slowly than the node 86. Because of this difference in charging times, the column bit lines 16 and 18 become completely connected to the pair of sense lines 28 and 30 through the column select circuit 26 just before the memory cell 12 becomes entirely connected to its associated bit lines. Because the previously read memory cell was in the stable mode corresponding to the binary state 0, the column bit lines 16 and 18 are at $V_{READ}$ and $V_{CC}$ respectively. This situation is shown graphically by the curves 218 and 220, which are representative of the voltages on the column bit lines 16 and 18 respectively. In the memory cell 12, the nodes 52 and 54 are at $V_{CC}$ and $V_{LO}$ respectively. At time $T_2$ the row selection signal applied at the nodes 70 and 72 is sufficient to begin to turn the MOSFET's 62 and 64 ON. When this happens the bit line 16 begins to charge from $V_{READ}$ to $V_{CC}$ and the bit line 18 begins to drop in voltage from $V_{CC}$ to $V_{READ}$. The column bit lines 16 and 18 are connected to the gate electrodes of a pair of MOSFET's 74 and 76 respectively. The drain of the MOSFET 74 is connected to the source of a MOSFET 78 whose drain is connected to the sense line 28. In like manner, the drain of the MOSFET 76 is connected to the source of a MOSFET 80 whose drain is connected to the sense line 30. The sources of the MOSFET's 74 and 76 are connected together at a common source node 82 which in turn is connected to the drain of a depletion mode MOSFET 84 having a gate electrode and a source both connected to ground.

The column select signal represented by the curve 214 and applied at the node 86 raises the voltage of the gate electrodes on the MOSFET's 78 and 80 turning them ON. The characteristics of MOSFET's 32, 34, 74, 76, 78, 80 and 84 are designed so that when the differential signals from the column bit lines 16 and 18 are applied to the gate electrodes of the MOSFET's 74 and 76, the MOSFET whose gate electrode is at $V_{CC}$ is ON and the MOSFET whose gate electrode is at $V_{READ}$ is OFF.

In the FIG. 1 embodiment, the threshold voltage $V_T$ for the MOSFET's 74 and 76 is approximately 1.3 volts. The depletion mode MOSFET 84 functions as a resistor to hold the common source node 82 at a voltage $V_{NODE}$ which is above ground potential and in this embodiment approximately 2 volts. If the voltage between the gate electrode and the source of an enhancement mode MOSFET is less than its threshold voltage, then the MOSFET is OFF. On the other hand, if the voltage between the gate electrode and the source of an enhancement mode MOSFET is greater than its threshold voltage, then the MOSFET is ON. In the present example, the gate electrode of the MOSFET 74 is at $V_{CC}$. Therefore, because $V_{CC} - V_{NODE}$ is greater than $V_T$, the MOSFET 74 is ON. Because the MOSFET 78 is also ON as explained above, current flows from the node 24 at $V_{CC}$ to ground through the MOSFET's 32, 78, 74 and 84. The depletion mode load MOSFET 32 acts as a resistor and has a voltage drop between its drain and source which establishes a sense line voltage $V_{SENSE}$ on the sense line 28. Correspondingly, the gate electrode of the MOSFET 76 is at $V_{READ}$. Therefore, because $V_{READ} - V_{NODE}$ is less than $V_T$, the MOSFET 76 is OFF. Because no current can flow through the MOSFET 76 to ground, the depletion mode load MOSFET 34 charges the sense line 30 to $V_{CC}$. In the presently preferred embodiment $V_{SENSE}$ is slightly less than $V_{READ}$. Therefore, there is a small amount of differential signal preamplification associated with the column selecting circuit 26.

It should be noted that an inversion of differential signals has occurred. The high signal $V_{CC}$ on the column bit line 16 is associated with that portion of the column select circuit 26 which supplies the low signal $V_{SENSE}$ on the sense line 28. Similarly, the low signal $V_{READ}$ on the column bit line 18 is associated with that portion of column select circuit 26 which supplies the high signal $V_{CC}$ on the sense line 30. At time $T_3$, in response to the changing voltages on the column bit lines 16 and 18, the voltages on the sense lines 28 and 30 represented graphically in FIG. 3 by curves 222 and 224 respectively, begin a transition to new voltage levels.

The sense amplifier of the invention 36 includes a pair of enhancement mode MOSFET's 88 and 90 whose sources are connected to ground at a common source node 92. The gate electrode of the MOSFET 90 is connected to the drain of the MOSFET 88 forming a first node 94. The gate electrode of the MOSFET 88 is connected to the drain of the MOSFET 90 forming a second node 96. A pair of depletion mode load MOSFET's 98 and 100 each have their associated sources and gate electrodes connected to the nodes 94 and 96 respectively. The drains of MOSFET's 98 and 100 are connected together at a common drain node 102 which is in turn connected to the selected positive supply voltage $V_{CC}$.

The MOSFET's 88 and 90 are configured to form a bistable flip-flop circuit. Connected to the nodes 94 and 96 are differential pull-down means which use the differential sense line voltages $V_{CC}$ and $V_{SENSE}$ to pull one side of the flip-flop low and allow the other side to return to $V_{CC}$. A path to ground is provided at the first node 94 through a pair of enhancement mode MOSFET's 104 and 106 connected in series at a node 108. A third MOSFET 110 has its source connected to the node 108 and its drain connected to the selected positive supply voltage $V_{CC}$. A similar path to ground is provided for the second node 96 through a pair of enchancement mode MOSFET's 112 and 114 connected in series at a node 116. A sixth enhancement mode MOSFET 118 has its drain connected to the selected positive supply voltage $V_{CC}$ and its source connected to the node 116. The sense line 28 is electrically connected to the gate electrodes of the MOSFET's 104, 106 and 118. The sense line 30 is electrically connected to the gate electrodes of the MOSFET's 110, 114 and 112.

The MOSFET's 110 and 118 are feed-back MOSFET's that bias the nodes 108 and 116, respectively, such that during a read operation either the MOSFET 104 or the MOSFET 112 is turned OFF. For example, during a read operation in which the binary state 1 is being detected, the signal on the sense line 28 is $V_{SENSE}$ and the signal on the sense line 30 is $V_{CC}$. When $V_{SENSE}$ is applied to the gate electrode of the MOSFET 118, this MOSFET sources very little current into the node 116 which stays at a voltage llow enough to keep the MOSFET's 112 and 114 ON. Thus, a D.C. current path to ground is provided for the second node 96 which is pulled down to $V_{LOW}$. In the FIG. 1 embodiment, $V_{LOW}$ is approximately 0.5 volts. Simultaneously, the voltage $V_{CC}$ applied to the gate electrode of the MOSFET 110 biases the node 108 high enough to turn the transistor 104 OFF. This eliminates the DC current path to ground for the first node 94 which is charged through the depletion mode MOSFET 98 to $V_{CC}$. Therefore, the feedback MOSFET's 110 and 118 and the ratio between MOSFET's 118 and 114 and MOSFET's 110 and 106 are designed to use the differential sense line voltages to force the flip-flop circuit formed by the MOSFET's 88 and 90 into one of the two stable operating modes thereby translating the differential input signals $V_{CC}$ and $V_{SENSE}$ into a pair of MOS digital level signals $V_{CC}$ and $V_{LOW}$. The output lines 40 and 42 are connected to the first node 94 and the second node 96 respectively and conduct the signals $V_{CC}$ and $V_{LOW}$ to the data output buffer 38.

At time $T_4$, in response to the changing voltages on the sense lines 28 and 30, the voltages on the differential amplifier output lines 40 and 42 represented graphically in FIG. 3 by curves 226 and 228, respectively, begin to transition.

The data output buffer 38 is a push-pull amplifier of conventional design. A pair of relatively high current enhancement mode MOSFET's 120 and 122 are connected as shown to the data output line 44 at a node 124. The drain of the MOSFEt 120 is connected to the selected positive supply voltage $V_{CC}$ and the source of the MOSFET 122 is connected to ground. The gate electrode of the MOSFET 120 is connected at a node 126 formed by the connection of the source of a depletion mode MOSFET 128 and the drain of an enhancement mode MOSFET 130. In like manner, the gate electrode of the MOSFET 122 is connected at a node 132 formed by the connection of the source of a depletion mode MOSFET 134 and the drain of an enhancement mode MOSFET 136. The drains of the MOSFET's 128 and 134 are connected to the selected positive supply voltage $V_{CC}$. The sources of the MOSFET's 130 and 136 are both connected to ground. The gate electrodes of the MOSFET's 130 and 134 are connected to the output line 42 while the gate electrode of the MOSFET's 128 and 136 are connected to the output line 40. During a read operation, when the binary state 1 is being detected, the output lines 40 and 42 will ultimately be at the voltages $V_{CC}$ and $V_{LOW}$ respectively.

Under such conditions, the high signal $V_{CC}$ on the line 40 will turn the MOSFET 136 ON and increase the conductance of the MOSFET 128. Similarly, the low signal $V_{LOW}$ on the line 42 will turn the MOSFET 130 OFF and decrease the conductance of the MOSFET 134. Because the depletion mode MOSFET 128 has increased conductance and the MOSFET 130 is OFF the node 126 will quickly recover to $V_{CC}$. Also, because the depletion mode MOSFET 134 has decreased conductance and the MOSFET 136 is ON the node 132 will stabilize to $V_{LOO}$. The $V_{LOO}$ value at the node 132 depends upon the ratio of the sizes of the MOSFET's 134 and 136. Since the node 126 is at the high signal $V_{CC}$ the enhancement mode MOSFET 120 will be turned ON. The MOSFET 120 provides a relatively high current path from the selected positive supply voltage $V_{CC}$ applied at the node 24 to the node 124 which is connected to the data output line 44. The characteristics of the MOSFET 120 are such that in the FIG. 1 embodiment the potential on the output line 44 is approximately 3 volts. Meanwhile, the low signal $V_{LOO}$ at the node 132 is sufficiently small so that the MOSFET 122 remains OFF thereby providing no current path to ground for the output node 44.

If the input signals to the data output buffer 38 were reversed, then the MOSFET 120 would be OFF and the MOSFET 122 would be ON providing a relatively high current path to ground for the data output line 44.

A curve 230 in FIG. 3 represents the signal on the data output line 44 during a read 1 operation. At some relative time $T_5$ after the signals on the lines 40 and 42 have partially transitioned, the data output buffer 38 begins to charge the output line 44 until the time $T_6$ the data output line 44 is fully charged. Since the operation of the FIG. 1 RAM is symmetrical, FIG. 3 can be used, with minor modifications, to visualize a read O operation. These modifications include substituting a curve 232 for the curve 230 and exchanging the reference numerals on the three pairs of curves; 218 and 220; 222 and 224; and 226 and 228. Again, for FIG. 3 to be correct, it will be understood that an immediately proceeding operation interrogated another memory cell in column 1 whose stable mode corresponded to the binary state 1.

Figure 2:
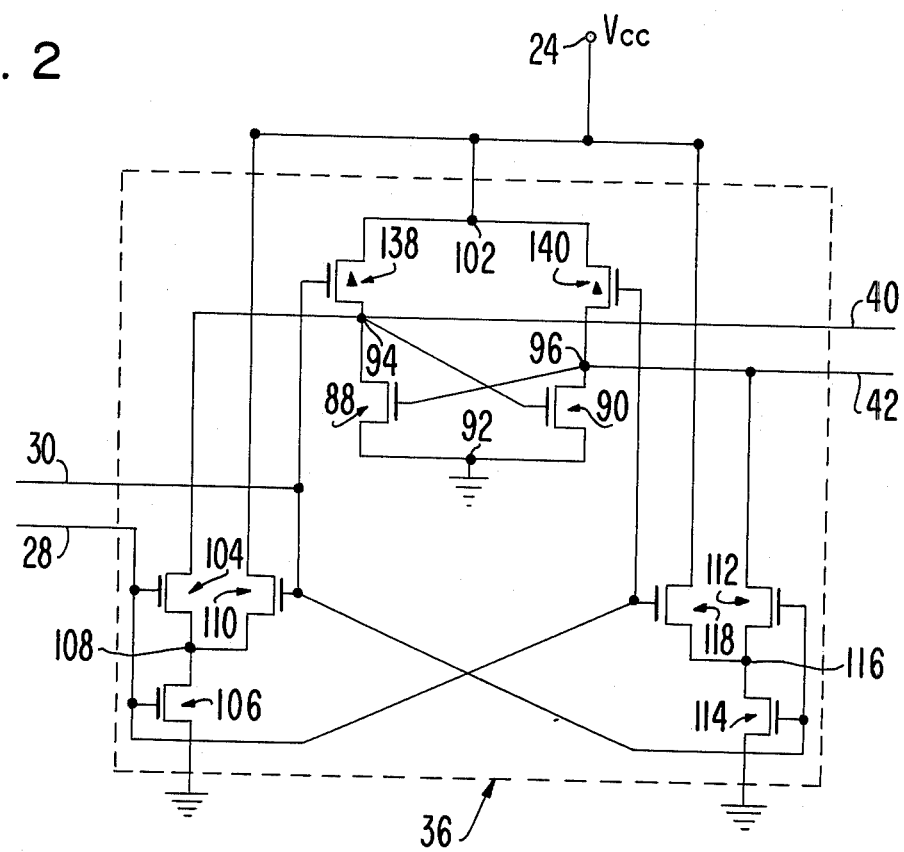
FIG. 2 is a schematic diagram of another embodiment of the invention.

Another embodiment of the present invention is shown in FIG. 2. This embodiment differs from the FIG. 1 embodiment in that the gate electrodes on the MOSFET's 138 and 140 are not connected to their respective sources as in the FIG. 1 embodiment but are rather connected as shown to the sense lines 30 and 28 respectively. The FIG. 2 embodiment provides current modulation in the load MOSFET's 138 and 140 which reduces the time required for the bistable flip-flop circuit to latch into one of its two stable operating modes. For example, if the high signal $V_{CC}$ is on the sense line 30 and the low signal $V_{SENSE}$ is on the sense line 28 then the MOSFET 140 would source less current to the second node 96 than the MOSFET 138 would source to the first node 94. Because less current is being sourced to the second node 96 the pull-down circuit comprised of MOSFET's 112, 114 and 118 pulls the second node 96 to $V_{LOW}$ more quickly. Moreover, the load MOSFET 138 sources a maximum amount of current to the first node 94 and speeds the recovery of that node to $V_{CC}$. The only disadvantage to this configuration is that the load MOSFET's 138 and 140 source more current in this configuration than do the MOSFET's 98 and 100 in the FIG. 1 embodiment. Therefore, larger transistor sizes are required for the MOSFET's 104, 106, 110, 112, 114 and 118 in the FIG. 2 embodiment.

The invention shown in the FIG. 1 embodiment is incorporated in integrated circuit form as part of Fairchild's 256 × 8 bit static RAM model No. 3539. The invention shown in the FIG. 2 embodiment is incorporated in integrated circuit form as part of Fairchild's 1024 bit static RAM model No. 2102. It is to be understood that although the circuit is used in a static RAM it can be used to translate any $V_{CC}$ referenced non-digital differential signals into ground referenced digital signals. Furthermore, the circuit has possible application where differential analog signals are to be converted to digital signals. The invention may also be employed to convert two differential emitter coupled logic level signals to MOS compatible signals if the emitter coupled logic levels are referenced to the $V_{CC}$ voltage rail.

From the foregoing detailed description it will be evident that there are a number of changes, adaptations and modifications of the present invention which come within the provience of those skilled in the art; however it is intended that all such variations not departing from the spirit of the invention be considered as within the scope thereof as limited solely by the appended claims.

What is claimed is:

1. A structure comprising:
a bistable amplifier means for sensing two signals at differing voltages, said bistable amplifier means possessing a first node and a second node; and,
differential pull-down means coupled to said first and second nodes for selectively latching said bistable amplifier means, said differential pull-down means comprising a selected voltage supply means; and, six enhancement mode MOSFET's 1, 2, ...i, ...6 wherein $i$ is an integer from 1 to 6 and the ith MOSFET has an ith gate electrode, an ith drain and an ith source, said first drain coupled to said first node, said second source coupled to ground, said third drain coupled to said selected supply voltage supply means;
said first source, said second drain and said third source being coupled together, said fourth drain being coupled to said second node, said fifth source coupled to ground, said sixth drain being coupled to said selected voltage supply means;
said fourth source, said fifth drain and said sixth source coupled together, said first, second and sixth gate electrodes being coupled together to form a first differential input signal terminal;
said third, fourth and fifth gate electrodes being coupled together to form a second differential input signal terminal, whereby when two signals at differing voltages are applied to said first and second terminals respectively, selective latching of said bistable amplifier means is accomplished.

2. The structure of claim 1 wherein said bistable amplifier means comprises:
a seventh enhancement mode MOSFET with a seventh gate electrode, a seventh drain and a seventh source; and,
an eighth enhanceent mode MOSFET with an eighth gate electrode being coupled to said seventh drain to form said first node, an eighth drain being coupled to said seventh gate electrode to form said second node, and an eighth source being coupled to said seventh source to form a common source node, which node is coupled to ground.

3. The structure of claim 2 additionally comprising:
a ninth depletion-mode MOSFET having a ninth gate electrode, a ninth drain and a ninth source, said ninth drain connected to said selected voltage supply means, said ninth gate electrode and said ninth source connected to said first node; and,
a tenth depletion-mode MOSFET having a tenth gate electrode, a tenth drain and a tenth source, said tenth drain connected to said selected voltage supply means, said tenth gate electrode and said tenth source connected to said second node.

4. The structure of claim 3 embodied as an integrated circuit on a chip of semiconductor material.

5. The structure of claim 2 additionally comprising:
a ninth depletion-mode MOSFET having a ninth gate electrode, a ninth drain and a ninth source, said ninth drain connected to said selected voltage supply means, said ninth source connected to said first node and said ninth gate electrode connected to said second differential input signal terminal; and,
a tenth depletion-mode MOSFET having a tenth gate electrode, a tenth drain and a tenth source, said tenth drain connected to said selected voltage supply means, said tenth source connected to said second node and said tenth gate electrode connected to said first differential input signal terminal.

6. The structure of claim 5 embodied as an integrated circuit on a chip of semiconductor material.

* * * * *